(12) United States Patent
Morrow

(10) Patent No.: US 12,151,535 B2
(45) Date of Patent: Nov. 26, 2024

(54) SYSTEMS AND METHODS FOR COOLING COMPONENTS OF A VEHICLE

(71) Applicant: Pony AI Inc., Grand Cayman (KY)

(72) Inventor: Luke Morrow, Gilroy, CA (US)

(73) Assignee: Pony AI Inc., Grand Cayman (KY)

( * ) Notice: Subject to any disclaimer, the term of this patent is extended or adjusted under 35 U.S.C. 154(b) by 577 days.

(21) Appl. No.: 15/931,523

(22) Filed: May 13, 2020

(65) Prior Publication Data

US 2021/0300145 A1    Sep. 30, 2021

Related U.S. Application Data

(60) Provisional application No. 62/994,686, filed on Mar. 25, 2020.

(51) Int. Cl.
| | |
|---|---|
| *B60H 1/00* | (2006.01) |
| *B62D 21/17* | (2006.01) |
| *H05K 7/20* | (2006.01) |

(52) U.S. Cl.
CPC ......... *B60H 1/00271* (2013.01); *B62D 21/17* (2013.01); *H05K 7/20863* (2013.01); *B60H 2001/003* (2013.01)

(58) Field of Classification Search
CPC .......... B60H 1/00271; B60H 2001/003; H05K 7/20863; B62D 21/17
See application file for complete search history.

(56) References Cited

U.S. PATENT DOCUMENTS

| | | | |
|---|---|---|---|
| 5,669,813 A * | 9/1997 | Jairazbhoy | ......... B60H 1/00271 361/645 |
| 7,866,169 B2 | 1/2011 | Errington et al. | |
| 8,733,428 B2 | 5/2014 | Nakajima | |
| 8,800,644 B2 | 8/2014 | Greiner et al. | |
| 9,854,717 B2 * | 12/2017 | Blackburn | .............. B60L 1/003 |
| 2004/0010358 A1 | 1/2004 | Oesterling et al. | |
| 2011/0165830 A1 | 7/2011 | Smith | |
| 2013/0273824 A1 | 10/2013 | Lang et al. | |
| 2013/0345893 A1 * | 12/2013 | David | ................ G05D 23/1919 700/300 |
| 2015/0183291 A1 * | 7/2015 | Higuchi | ............. B60H 1/00849 62/133 |
| 2016/0244010 A1 * | 8/2016 | Tseng | ................. B60H 1/00778 |
| 2019/0289754 A1 * | 9/2019 | Hubbard | ........... G02F 1/133308 |
| 2021/0138872 A1 * | 5/2021 | Göthlin | .................. B60H 1/246 |

FOREIGN PATENT DOCUMENTS

| | | | | |
|---|---|---|---|---|
| CN | 111345122 A | * | 6/2020 | ............. B60H 1/143 |
| GB | 2343164 A | | 5/2000 | |

OTHER PUBLICATIONS

Translation CN-111345122 (Year: 2020).*
International Search Report and Written Opinion for PCT/US2021/023897 dated Aug. 6, 2021, 12 pages.

* cited by examiner

*Primary Examiner* — David J Teitelbaum
(74) *Attorney, Agent, or Firm* — Sheppard, Mullin, Richter & Hampton LLP; Xin Xie

(57) ABSTRACT

Systems and methods are provided for cooling air in a vehicle. The system includes a chassis, inside an interior area of a vehicle, with one or more openings that are configured to allow air to enter the chassis to cool a heat generating component in the vehicle and an exhaust duct that directs the air away from the chassis after the air has contacted at least a portion of the heat generating component. The system includes a fan that acts to propel the air through the one or more openings and through the exhaust duct.

17 Claims, 9 Drawing Sheets

SYSTEMS AND METHODS FOR COOLING COMPONENTS OF A VEHICLE

CROSS-REFERENCE TO RELATED APPLICATION

This application claims the benefit of U.S. Application No. 62/994,686 filed Mar. 25, 2020, the contents of which are incorporated herein in its entirety.

FIELD OF THE INVENTION

This disclosure relates to the field of heat regulation of heat sources in a vehicle.

BACKGROUND

Electronic heat sources (computers, servers, etc.) enclosed inside vehicles or buildings radiate heat and result in the consumption of a significant amount of energy to maintain air temperature via refrigeration or heat exchange and recirculation. Autonomous vehicles currently require a significant amount of compute power, resulting in a significant reduction in driving range. Existing systems to reduce temperature of the electronic heat sources increase ambient air temperature in the space or room. The increased temperature of ambient air requires increased energy to cool. Unless an energy efficient thermal management solution is used, inefficiency has a direct fuel cost and an indirect cost on time to refuel or recharge.

In particular, computing components in vehicles generate enough heat that the computing components require cooling, which increases the temperature of an overall system within the vehicle and increases the cooling requirements of the computing components. However, the heat generated by computing components of a vehicle is often disregarded as small in comparison to the other components of a vehicle such as the engine or batteries. But as the power of computing components in vehicles increases, so too does their cooling requirements. This is particularly the case in autonomous vehicles. Further, computing components that share an interior space with passengers may directly raise the temperature of ambient air in the interior space. The compact space requirements in a vehicle also limit options for dealing with the heat. There is a need in the art for more efficient forms of cooling for the computing components of vehicles.

SUMMARY

The present disclosure includes systems for cooling ambient air in a vehicle. In an exemplary embodiment, a system includes a chassis, inside an interior area of a vehicle, with one or more openings that are configured to allow air to enter the chassis to cool a heat generating component in the vehicle and an exhaust duct that directs the air away from the chassis after the air has contacted at least a portion of the heat generating component. The system includes a fan that activates to propel the air through the one or more openings and through the exhaust duct. The system may further include a manifold that is configured to receive the air from the heat generating component where the exhaust duct is connected to the manifold. The heat generating component may be an electronic component with a processor. The air may be cooled, prior to entering the chassis, by an air conditioning system in the vehicle. The air conditioning system may be configured to modify an output of the air conditioning system responsive to a temperature of the electronic component where the air conditioning system is further configured to modify the output of the air conditioning system based on historical data from the electronic component. The air conditioning system may be further configured to direct air that is cooled by the air conditioning system separately into two or more vehicle chambers; the vehicle chambers comprising: a cabin of the vehicle and the chassis. The exhaust duct may be positioned to direct the air, after the air has been heated by the heat generating component, into one or more vehicle components. The one or more vehicle components may include one or more windows. The fan may be positioned inside the exhaust duct.

In an exemplary embodiment, a method includes cooling a heat generating component within an interior area in a vehicle with air that enters a chassis through one or more openings in the chassis and directing the air away from the chassis in an exhaust duct after the air has cooled the heat generating component. The method includes propelling the air out of the chassis through the exhaust duct with a fan. A manifold may be configured to receive air from the heat generating component and the exhaust duct may be connected to the manifold. The heat generating component may be an electronic component with a processor. The air may be cooled, prior to entering the chassis, by an air conditioning system in the vehicle. The air conditioning system may be configured to modify an output of the air conditioning system responsive to a temperature of the electronic component where the air conditioning system is further configured to modify the output of the air conditioning system based on historical data from the electronic component. The air conditioning system may be further configured to direct air that is cooled by the air conditioning system separately into two or more vehicle chambers. The two or more vehicle chambers may include a cabin in the vehicle and the chassis. The exhaust duct may be positioned to direct air, after the air has been heated by the heat generating component, into one or more vehicle components. The method may further include defrosting one or more windows of the vehicle with the air after the air has been heated by the heat generating component. The fan may be positioned inside the exhaust duct.

In various embodiments, a system includes one or more openings that are configured to allow air to enter a chassis to cool an electronic component with a processor in a vehicle and an exhaust duct that directs the air away from the chassis after the air has cooled the electronic component. The system includes a fan inside the exhaust duct that acts to force the air into the one or more openings and out through the exhaust duct and a manifold that is configured to receive the air from the electronic component where the exhaust duct is connected to the manifold. The air may be cooled, prior to entering the chassis, by an air conditioning system in the vehicle. The air conditioning system may be configured to modify an output of the air conditioning system responsive to a temperature of the electronic component and based on historical data from the electronic component. The exhaust duct may be positioned to direct the air, after the air has been heated by the electronic component, into one or more vehicle components.

DETAILED DESCRIPTION

Figure 1:
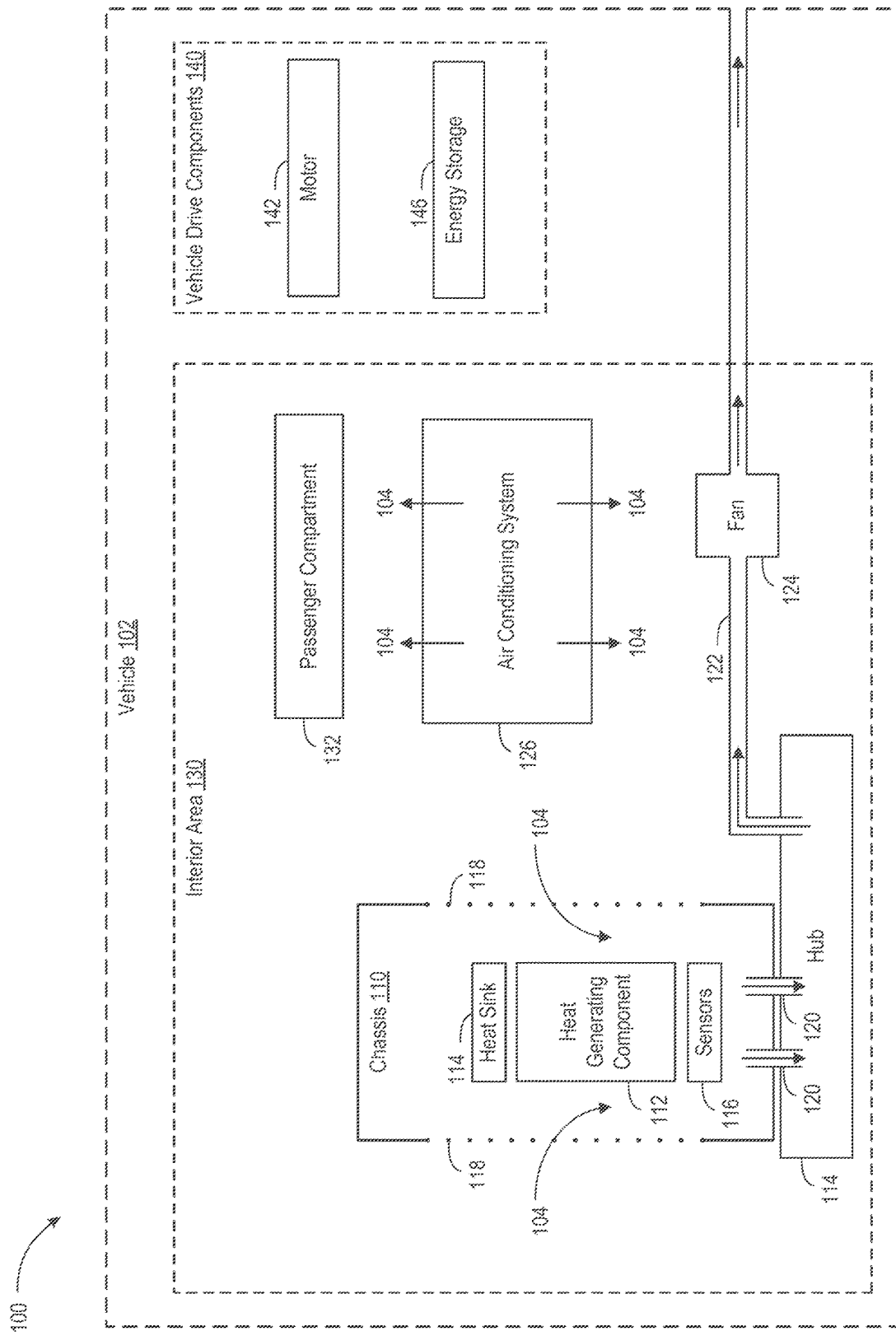
FIG. 1 is a schematic illustrating the components that may be used in a system for cooling components in a vehicle.

The disclosed subject matter is a system for cooling various heat generating components of a vehicle. The heat generating components may increase the temperature of the air inside the vehicle. Heat is transferred from the various heat generating components of the vehicle to the air through convection by using a fan to cause air to flow into contact with a heat generating component or components that are in thermal contact with a heat generating components. Cooling the computing components with a fan does not eliminate the heat, but merely transmits the heat into the air. The air may be continuously brought into contact with the various components of the vehicle by using a fan or pump.

After heat is transmitted to the air through convection, the heated air may be isolated so that it may not transmit heat back into the environment within the vehicle. The system isolates and concentrates hot air to actively remove it from the computing environment and replenish the evacuated air with fresh air. Active cooling of the fresh air may be accomplished by an air conditioning system, but at a reduced cost than if heat air is mixed with the fresh air. The isolated air may be expelled from the vehicle or used to selectively heat one or more vehicle components. A manifold may be used to concentrate the air after the heat is transmitted to the air. Once in the manifold, the air may be directed at will to various components in the vehicle that can be heated. Alternatively, the heated air can be expelled from the vehicle.

The various components of the vehicle may comprise computing components such as processors. Autonomous vehicles, in particular, have a high processing demand from computing components, which in turn generate heat that is proportional to the amount of processing that has been performed. Processors, for instance, do not operate efficiently outside of a preferred temperature range and have a decreased life span when they operate outside of their preferred temperature range. Thus, fans are used to keep processors within a temperature range, which through their use, increases the temperature of the air inside the vehicle. By isolating the air, the temperature of the environment inside the vehicle may not increase.

As an added benefit, the disclosed subject matter may be used to decrease the sound inside a vehicle, which is to the benefit of passengers in the vehicle. Sound from the fan is isolated and does not propagate into the environment inside the vehicle. As sound waves naturally dissipate with time, the sound may dissipate as the air is isolated.

The heat generating components may be covered by a chassis with openings. Air may enter the chassis through the openings to cool the heat generating components. The air may be directed into a manifold after the air has cooled the heat generating components. A manifold or other chamber may be used to isolate the heated air. Connected to the manifold may be an exhaust duct. The heated air may flow through the exhaust duct to be expelled from the vehicle or to heat a vehicle component. In various embodiments, a fan may be placed in the exhaust duct to propel the heated air through the exhaust duct.

Referring to FIG. 1, FIG. 1 is a schematic illustrating the components that may be used in a cooling system 100 for components in a vehicle 102. The system may be used to cool components in a vehicle 102 without transmitting heat into the environment inside the vehicle 102. The cooling system 100 may also be used to reduce the noise of mechanisms that act to cool heat generating components 112 in a vehicle 102.

The cooling system 100 uses air 104 to cool a heat generating component 112 in a vehicle 102. The vehicle 102 may be various passenger carrying machine such as, but not limited to, automobiles, trucks, planes, helicopters, trains, and boats. Air 104 flows within the vehicle 102 and is used to cool a heat generating component 112. The heat generating component 112 may be various components in a vehicle such as a computer processor or a monitor.

The heat generating component 112 may be inside a chassis 110 with openings 118 that covers the heat generating component 112. The chassis 110 may act to constrict the flow of air to the heat generating component 112 such that the flow of air 104 through the openings 118 in the chassis 110 is always in one direction. As such, heat that is produced by the heat generating component 112 may not exit the chassis 110 through the openings 118 in the chassis 110. In various embodiments, the heat generating component 112 may have sensors 116 that can measure various properties of the heat generating component 112 such as a temperature of the heat generating component 112.

In various embodiments, the heat generating component 112 may be in thermal contact with a heat sink. The heat sink may be configured to conduct heat away from the heat generating component 112. The heat sink may be further positioned to be in contact with air 104 that enters the chassis 110. Heat may be transferred by convection from the heat sink to air 104 that enters the chassis 110.

The chassis 110 may be configured such that air that enters the chassis 110 through the openings 118 does not leave the chassis 110 through the openings 118. In various embodiments, the chassis 110 is configured to have a lower pressure inside the chassis 110 than outside the chassis 110. In an exemplary embodiment, the openings 118 comprise pneumatic valves that allow gas to pass only in one direction.

The chassis 110 may be connected to a manifold 114 by one or more conduits 120. The conduits 120 may be configured to receive the air that has been heated by the heat generating component 112 into the manifold 114. In various embodiments, one or more fans may direct the flow of air through the conduits 120 into the manifold 114. In an exemplary embodiment, the one or more conduits 120 may contain a pneumatic valve such as a check valve that allows gas to flow in only one direction. The flow of heated air into the manifold 114 through the conduit 120 allows air 104 to continuously flow into the chassis 110 through the openings 118.

The manifold 114 may comprise a chamber that holds a volume of gas. The heated air may be concentrated in the manifold 114. As such, the manifold 114 may be layered with a thermally insulating material to prevent the transmission of heat to the environment outside the manifold 114. The manifold 114 may be sealed to prevent the heated air from leaking into the environment outside the manifold 114. Once the heated air is in the manifold 114, the heated air may be further directed into an exhaust duct 122.

The exhaust duct 122 may direct the heated air from the manifold 114 to another part of the vehicle 102. In various embodiments, the exhaust duct 122 may direct the heated air to the outside of the vehicle 102 to expel the heated air from the vehicle 102. In various embodiments, the exhaust duct 122 may contain a fan 124 that, when activated, propels the heated air away from the manifold 114. The fan 124 may comprise various mechanisms that propel air into the exhaust duct 122 away from the manifold 114. In an exemplary embodiment, the fan 124 is a suction motor, such as but not limited to, a centrifugal pump or any other type of pump. Also, in an exemplary embodiment, the fan 124 is an axial-flow fan that is positioned in the exhaust duct 122.

As shown in FIG. 1, the fan 124 is inside the exhaust duct 122. In various embodiments the fan 124 is in the conduit 120 instead of the exhaust duct 122. Alternatively, both the exhaust duct 122 and the conduit 120 has a fan 124. In an exemplary embodiment, the fan 124 in the exhaust duct 122 is the sole source of air flow in the cooling system 100, which comprises air 104 flowing through the openings 118 into the chassis 110, getting heated by the heat generating component 112, flowing through the conduit 120 into the manifold 114 and into the exhaust duct 122. In various embodiments, and as shown in FIG. 1, the exhaust duct 122 may deposit the heated air outside of the vehicle 102.

The fan 124 may be activated responsive to measurements from the sensors 116 that measure a property of the heat generating component 112. For example, the fan 124 may activate when the sensors 116 measure a temperature of the heat generating component 112 above a threshold. In another example, the fan 124 may activate when the sensors 116 measure an increased power usage by the heat generating component 112.

In various embodiments, the air 104 may be recieved from an interior area 130 that is shared by the passengers of the vehicle 102. The air in the interior area 130 may be cooled by an air conditioning system 126 in the vehicle 102. The air 104, cooled by the air conditioning system 126 in the interior area 130, may cause the cooling system 100 to be more efficient. In various embodiments, the air conditioning system 126 may activate responsive to measurements from the sensors 116. For example, the air conditioning system 126 may activate responsive to a measurement of a temperature above a threshold by the sensors 116.

In an exemplary embodiment, the air conditioning system 126 may preemptively activate in anticipation of a cooling need by the heat generating component 112. For example, the air conditioning system 126 may determine, from historical data, that the heat generating component 112 may require cooling. The historical data may be past data from the sensors 116. In one example the historical data may indicate that the temperature of the heat generating component 112 rises above a threshold when the heat generating component 112 performs a function for an amount of time, such as playing a video for greater than 30 min. The air conditioning component 126 may preemptively activate when the function is performed and before the temperature of the heat generating component 112 rises above the threshold.

The interior area 130 of the vehicle 102 is a region of the vehicle 102 that contains a passenger compartment 132 and is thermally separate from vehicle drive components 140 such as a motor 142. The air 104 that enters the chassis 110 is in thermal equilibrium with the air 104 in the interior area 130. In various embodiments, the air conditioning system 126, which controls the temperature of the air 104 in the passenger compartment 132, also controls the temperature of the air 104 that enters the chassis 110. As such, cooling of the air 104 by the air conditioning system 126 may result in more efficacious cooling of the heat generating component 112.

The vehicle drive components 140 provide the transport function for the vehicle 102. The vehicle drive components 140 may include components that convert energy into motion that propels the vehicle 102 and components that direct the motion of the vehicle 102. In various embodiments, the vehicle drive components 140 may be separated from the interior area 130 of the vehicle 102 so the heat produced by the vehicle drive components 140 do not significantly increase the temperature of the interior area 130.

In an exemplary embodiment, the vehicle drive components 140 may include a motor 142 and energy storage 146. The motor 142 may convert energy storage 146 into mechanical motion that moves the vehicle. In various embodiments, the motor 142 is an internal combustion engine that converts the energy in liquid fuel into mechanical motion. In an exemplary embodiment, the motor 142 is an electric motor that converts electrical energy into mechanical motion.

Figure 2:
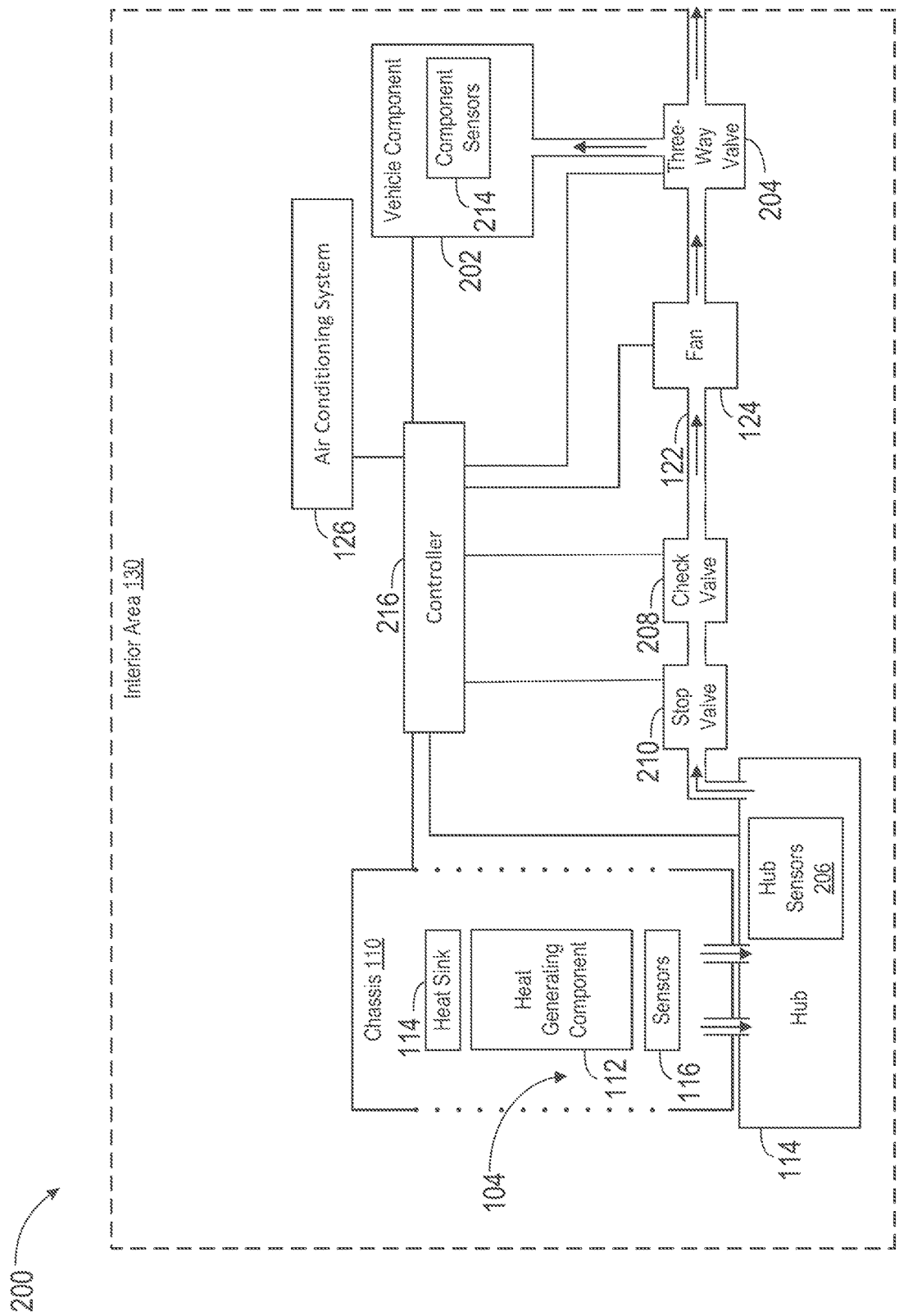
FIG. 2 is a schematic illustrating the components that may be used in a system for cooling components in a vehicle.

Referring to FIG. 2, FIG. 2 is a schematic 200 illustrating the components that may be used in the cooling system 100 for cooling components in the vehicle 102. As shown in FIG. 2, the exhaust duct 122 may direct the heated air to one or more vehicle components 202 in the interior area 130 of the vehicle 102. The exhaust duct 122 may contain one or more valves to control the flow of air through the exhaust duct 122. The one or more valves may be operated for various purposes including, but not limited to: controlling the direction of air flowing in the exhaust duct 122, controlling the air flow speed, controlling the air flow pressure, and shutting off the air flow.

As shown in FIG. 2, the exhaust duct may hold various valves including a stop valve 210, a check valve 208, and a three-way valve 204. In an exemplary embodiment, the various valves may be connected to a controller 216 that operates the various valves. The controller 216 may also be connected to various components of the cooling system 100 such as the chassis 110, manifold 114, fan 124, air conditioning system 126, and vehicle component 202.

The stop valve 210 may be configured to close off a flow of air in the exhaust duct 122. When activated, the stop valve 210 may be sealed to prevent the flow of any gas through the exhaust duct 122 in any direction. In an exemplary embodiment, the stop valve 210 may be sealed and opened by the action of an actuator that is operated by the controller 216.

The check valve 208 may be a valve that is configured to allow air in the exhaust duct 122 to flow in only one direction. In an exemplary embodiment, the check valve 208 is a spring check valve, whereby a spring may seal the check valve 208 when air flows in one direction and opens the check valve 208 when air flows in the other direction. The check valve 208 may be further configured to only allow air to flow across the check valve 208 when the air has a minimum pressure in one direction. In an exemplary embodiment, the check valve 208 may be configured to remain closed until air in the manifold 114 reaches a minimum pressure. In various embodiments, the check valve 208 may be operated by the controller 216. In one example, the controller 216 may set the minimum pressure for air to flow across the check valve 208.

In various embodiments, the cooling system 100 may be configured to direct air that is heated by the heat generating component 112 to a vehicle component 202 that benefits from heating. As shown in FIG. 2, a branch of the exhaust duct 122 may allow the air to either leave the vehicle 102 or be directed to a vehicle component 202. A three-way valve 204 may direct air that is flowing through the exhaust duct 122 down one or both branches. The controller 216, connected to the three-way valve 204, may be used to select the branch for which air is directed by the three-way valve 204. In an exemplary embodiment, the three-way valve 204 may have a servo motor that, when operated, changes the branch for which the three-way valve 204 directs air. The controller may send signals that, when executed, operate the servo motor in the three-way valve 204.

The controller 216 sends and receives electrical signals to and from the various components of the cooling system 100. The controller 216 may be configured with a processor and memory to carry out instructions to operate the cooling system 100. As shown in FIG. 2, the controller 216 may be connected to various components including, but not limited to: the chassis 110, the manifold 114, the air conditioning system 126, the stop valve 210, the check valve 208, the fan 124, the three-way valve 204, and the vehicle component 202. For example, the controller 216 may receive data from the sensors 116 in the chassis 110 or the manifold sensors 206. The controller 216 may also receive data from the component sensors 214.

In an exemplary embodiment, the controller 216 may operate the cooling system 100 by sending instructions to various components such as the stop valve 210, check valve 208, fan 124, air conditioning system 126, and three-way valve 204. The controller 216 may be programmed to operate the cooling system 100 based on data received from the various sensors in the cooling system 100. For example, the controller 216 may be programmed to open the stop valve 210 and turn on the fan 124 responsive to data from the sensors 116. In one implementation, the controller 216 may be configured to activate the cooling system 100 when the sensors 116 send data to the controller 216 that indicate that the heat generating component 112 is above a maximum temperature. In another implementation, the controller 216 may activate the cooling system 100 responsive to data that indicates that the heat generating component 112 will rise above a maximum temperature within an amount of time. The controller 216 may collect data from the heat generating component 112 to determine that the heat generating component 112 will increase in temperature. For example, if the heat generating component 112 is a navigation computer, the controller 216 may receive a state of the navigation computer, such as "navigating" or "not navigating." The controller 216 may activate the cooling system 100 whenever the navigation computer is in a "navigating" state.

The manifold sensors 206 may collect data from the manifold 114 and send the data to the controller 216. Data that may be collected by the manifold sensors 206 includes, but is not limited to the temperature of air in the manifold 114, the flow speed of air in the manifold 114, and the pressure of air in the manifold 114. In an exemplary embodiment, the manifold sensors 206 measure the temperature inside the manifold 114 and transmit the temperature measurement to the controller 216. The controller 216 may be configured to operate the cooling system 100 based on data received from the manifold sensors 206. For example, the controller 216 may activate the cooling system 100 responsive to receiving a pressure measurement from the manifold sensors 206.

In various embodiments, the air 104, may be directed to one or more vehicle components 202 after the air is heated by the heat generating component 112. In one implementation, heated air may be directed to the windows of the vehicle 102 to defrost the windows responsive to fogging of the windows. In another implementation, heated air may be directed to heating passenger comfort components such as vehicle seats or a steering wheel. The vehicle component 202 may have one or more component sensors 214 that measure properties of the vehicle component 202. For example, the component sensors 214 of a vehicle window may measure the transparency of the vehicle windows. The measurement of the component sensors 214 may be transmitted to the controller 216. The controller 216 may activate the cooling system 100 responsive to data from the component sensors 214.

Figure 3:
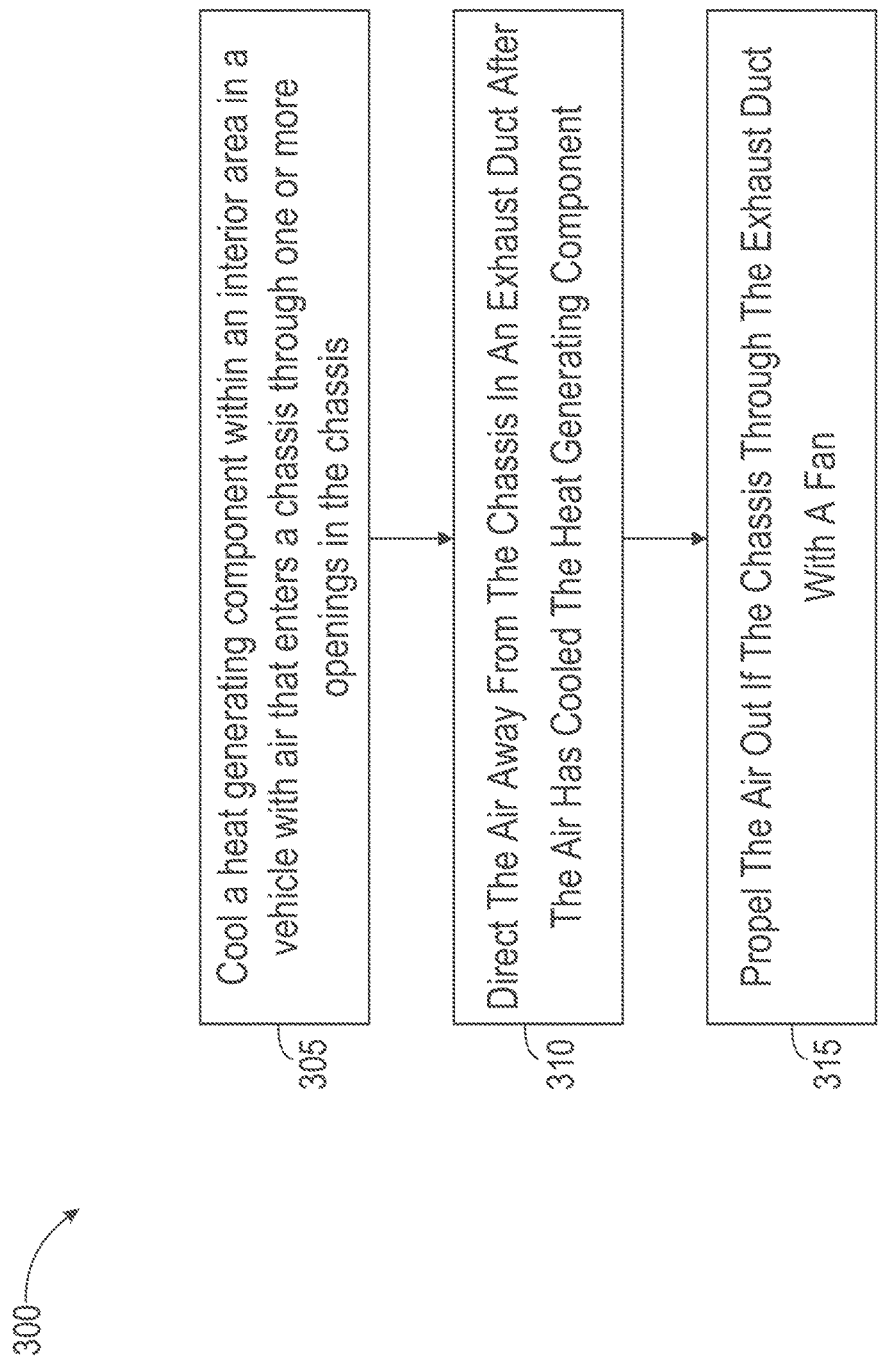
FIG. 3 is a flow diagram of a process for cooling a heat generating component in a vehicle.

Referring to FIG. 3, FIG. 3 is a flow diagram of a process 300 for cooling a heat generating component 112 in a vehicle 102. The process 300 may cool a heat generating component 112 by transmitting heat in the heat generating component 112 to air 104 through convection. The heated air may be directed away from the chassis 110 so that heated air does not increase the temperature of the air in or around the chassis 110.

At step 305, the cooling system 100 may cool a heat generating component 112 within an interior area 130 in a vehicle 102 with air 104 that enters a chassis 110 through one or more openings 118 in the chassis 110. The chassis 110 may be configured with openings 118 such that air 104 flows in one direction through the openings 118 when pressure is lowered within the chassis 110. Air 104 that enters the chassis 110 may come from an interior area 130 of the vehicle 102 and be in thermal equilibrium with the interior area 130. The passenger compartment 132 may be in thermal equilibrium with the air 104 that enters the chassis 110.

At step 310, the cooling system 100 may direct the air away from the chassis 110 in an exhaust duct 122 after the air has contacted the heat generating component 112. Heat may be transferred to the air 104 by convection from the heat generating component 112 when the air contacts the heat generating component 112. The heated air is directed away from the heat generating component 112 to prevent the heated air from transmitting the heat of the heat generating component to the chassis 110. In various embodiments, the heated air is directed out of the interior area 130 to prevent air 104 in the interior area from receiving heat from the heat generating component 112.

At step 315, the cooling system 100 may propel the air out of the chassis 110 through the exhaust duct 122 with a fan 124. The fan 124 may be a suction motor in the exhaust duct 122 that acts to induce air flow through the exhaust duct 122. In an exemplary embodiment, the air may be directed into a manifold 114 before flowing into the exhaust duct 122. The flow of air through the exhaust duct 122 may cause air to flow through the cooling system 100 by entering the chassis 110 through the one or more openings 118 and exit through the exhaust duct 122.

Figure 4:
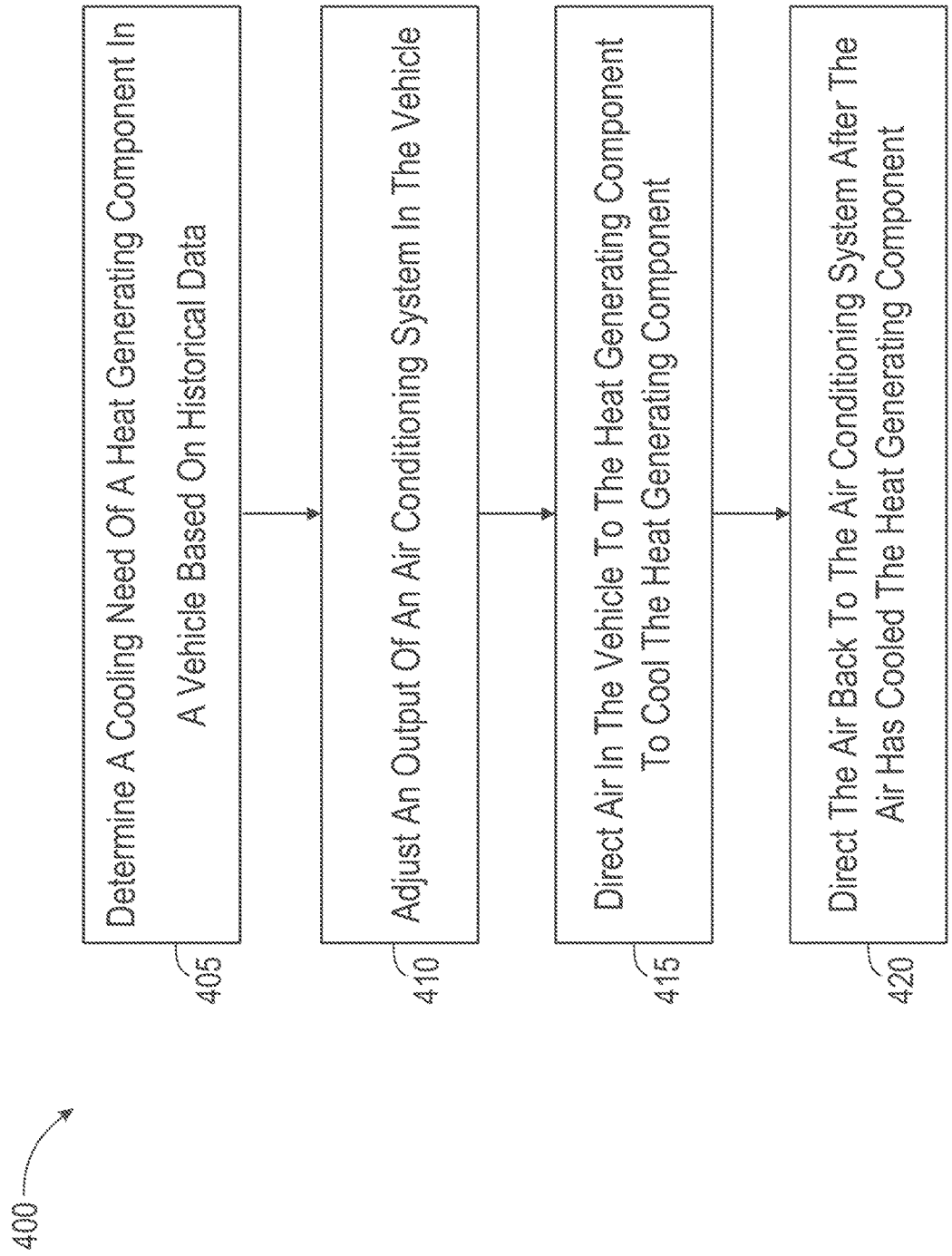
FIG. 4 is a flow diagram of a process of adjusting an air conditioning system to cool a heat generating component in a vehicle.

Referring to FIG. 4, FIG. 4 is a flow diagram 400 of a process of adjusting an air conditioning system 126 to cool a heat generating component 112 in a vehicle 102. The air conditioning system 126 may control the temperature of an interior area 130 of the vehicle 102. By using the temperature-controlled air of the air conditioning system 126, the cooling system 100 may efficiently cool a heat generating component 112 without requiring a separate cooling component.

At step 405, the cooling system 100 may determine a cooling need of a heat generating component 112 in a vehicle 102 based on historical data. The historical data may include past sensor measurements from the sensors 116, and the manifold sensors 206. The historical data may also include past data from states of the heat generating component 112, the stop valve 210, the check valve 208 and the air conditioning system 126. For example, historical data may indicate that the temperature, measured by the sensors 116, rises above a value after the heat generating component 112 is in an "on" state for an amount of time. The cooling need may be determined by the controller 216 by analyzing past data of the various sensors and components of the cooling system 100.

At step 410, the cooling system 100 may adjust an output of an air conditioning system 126 in the vehicle 102, responsive to the determination of a cooling need of the heat generating component 112. The cooling need of the heat generating component 112 may be determined from a high temperature of the heat generating component 112 as measured by the sensors 116 or a prediction, by the controller 216 that the heat generating component 112 will increase in temperature. The output of the air conditioning system 126 may be adjusted to reduce the temperature of the air 104 in the interior area 130.

At step 415, the cooling system 100 may direct air 104 in the vehicle 102 to the heat generating component 112 to cool the heat generating component 112. The air 104 may be directed to the heat generating component 112 in various ways. In an exemplary embodiment, the fan 124 may be activated by the controller 216. Once activated, the fan 124 may cause air in the cooling system 100 to flow into the chassis 110 through the one or more openings 118 to cool the heat generating component 112. In various embodiments, the controller 216 may send a signal to the stop valve 210 that, when executed, causes the stop valve 210 to open the exhaust duct 122 and allow air to flow through it. The air 104 in the vehicle 102 may be cooled by the air conditioning system 126, which increases the cooling efficacy of the air 104. The air conditioning system 126 may simultaneously cool the air 104 the passenger compartment 132.

At step 420, the cooling system 100 may direct the air back to the air conditioning system 126 after the air has cooled the heat generating component 112. The air conditioning system 126 may cool air that has been heated by the heat generating component 112. The controller may send a signal to the three-way valve 204 that, when operated, opens a branch of the exhaust duct 122 that leads to various vehicle components 202. Although shown as separate components in FIG. 2, the vehicle component 202 may comprise the air conditioning system 126.

Figure 5:
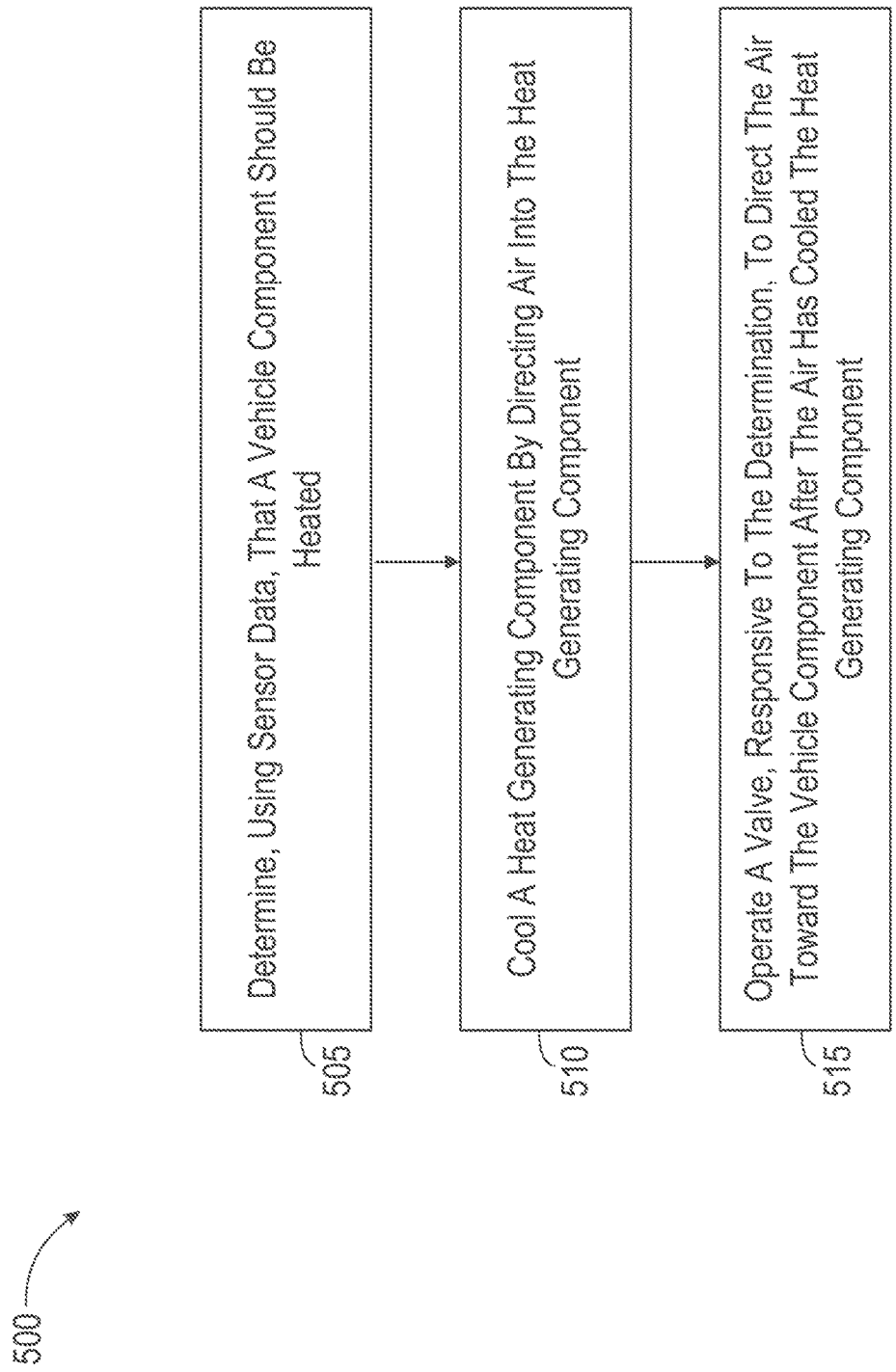
FIG. 5 is a flow diagram of a process of heating a vehicle component with air that is heated by a heat generating component.

Referring to FIG. 5, FIG. 5 is a flow diagram 500 of a process of heating a vehicle component 202 with air that is heated by the heat generating component 112. The cooling system 100, by its nature, cools a heat generating component 112 through transfer of heat to air by convection. In various embodiments, the heated air may be used to heat one or more vehicle components 202 by delivering the heated air through a branch in the exhaust duct 122.

At step 505, the controller 216 may determine, using sensor data, that a vehicle component 202 should be heated. The controller 216 may receive data from the component sensors 214 to monitor the one or more vehicle components 202. In various embodiments, the controller 216 may be programmed to determine that the vehicle component 202 should be heated when a threshold is met in data that is received from the component sensors 214. In an exemplary embodiment, the vehicle component 202 may comprise a window in the vehicle 102. The component sensors 214 may measure the fogging of the window. The controller 216 may determine that the window should be heated responsive to data from the component sensors 214 that indicates that the window is fogging over.

At step 510, the controller 216 may send a signal, that when executed, causes the cooling system 100 to cool a heat generating component 112 by directing air 104 into the heat generating component 112. The air 104 may be directed from an interior area 130 of the vehicle 102 to enter the chassis 110 to cool the heat generating component 112. Through convection, the air may be heated in the process of cooling the heat generating component 112. The heated air may be further directed to the vehicle component 202.

At step 515, the controller 216 may send a signal to operate a valve, responsive to the determination, to direct the air toward the vehicle component 202 after the air has cooled the heat generating component 112. In various embodiments, the controller 216 may instruct the three-way valve 204 to direct air in the exhaust duct 122 to the vehicle component 202. In an exemplary embodiment, the vehicle component 202 is a passenger seat that a component sensor 214 measured as below a threshold temperature. The heated air may be directed into the passenger seat responsive to the determination.

Figure 6:
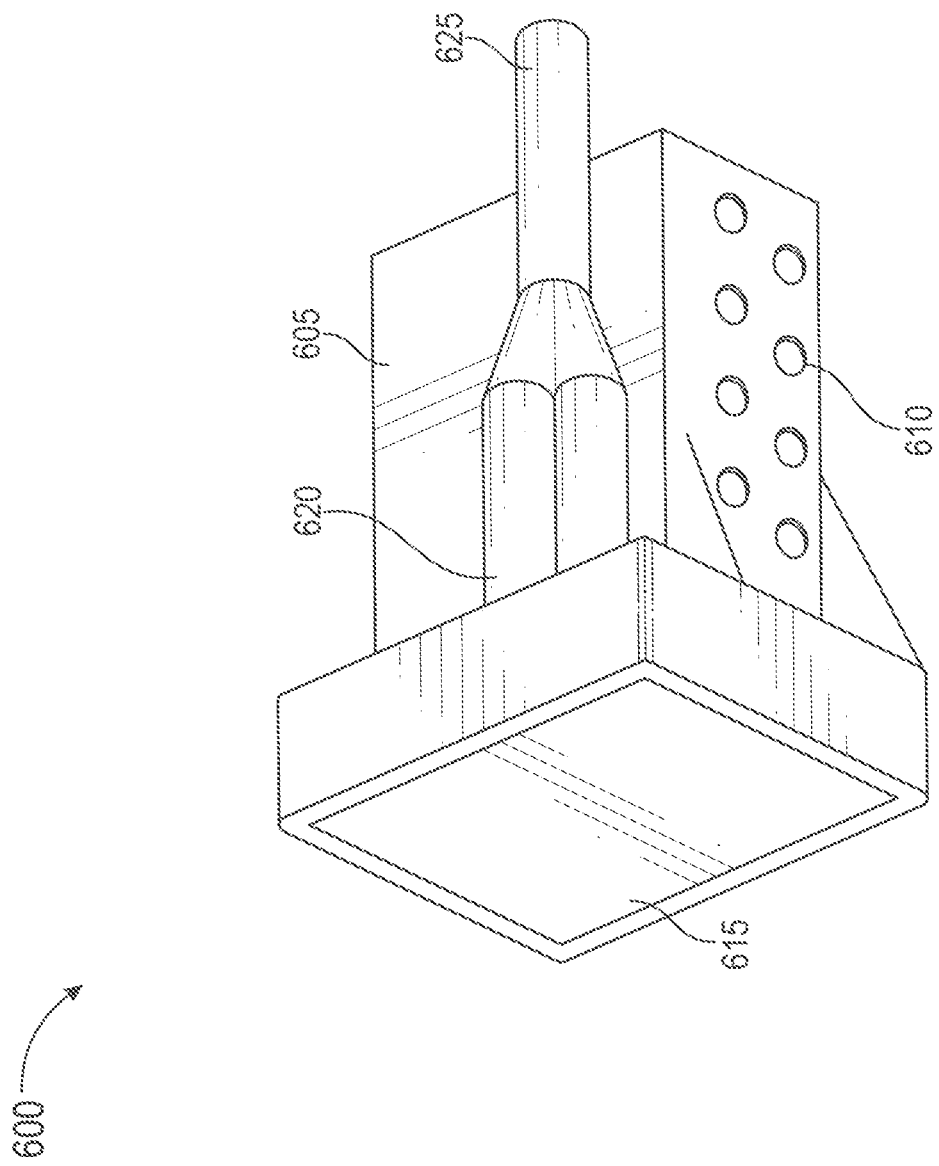
FIG. 6 is an illustration of various components of the cooling system in a vehicle.

Referring to FIG. 6, FIG. 6 is an illustration of various components of the cooling system 100 in the vehicle 102. The cooling system 100 may be employed to reduce the temperature of a heat generating component 112 such as a vehicle computer or a monitor or speakers. The heat generating component 112 may be placed inside a chassis 605 that has one or more openings 610. The one or more openings 610 may allow air 104 to flow in one direction through the one or more openings into the chassis 605 when there is a lower pressure inside the chassis 605 than outside within the interior area 130.

The air 104 may flow through the chassis 605 to cool the heat generating component 112 that is inside the chassis 605. Through convection, heat may be transferred from the heat generating component 112 to the air 104 resulting in heated air. As the air 104 only flows into the chassis 605, the heated air does not mix with the air 104 outside the chassis 605 in the interior area 130 of the vehicle 102. Instead, the air 104 flows into the openings 610 through the chassis 605 and into the manifold 615.

The heated air may continue flowing through the manifold 615 into the exhaust duct 620. The exhaust duct 620 may contain one or more valves that operate to control the flow of heated air through the cooling system 100. The exhaust duct 620 may also contain one or more fans 124 that, when activated, propel the heated air through the chassis 605, manifold 615, and exhaust duct 620. In various embodiments, the exhaust duct 620 may deliver the heated air through an opening 625 whereby the heated air is expelled from the vehicle 102.

Figure 7:
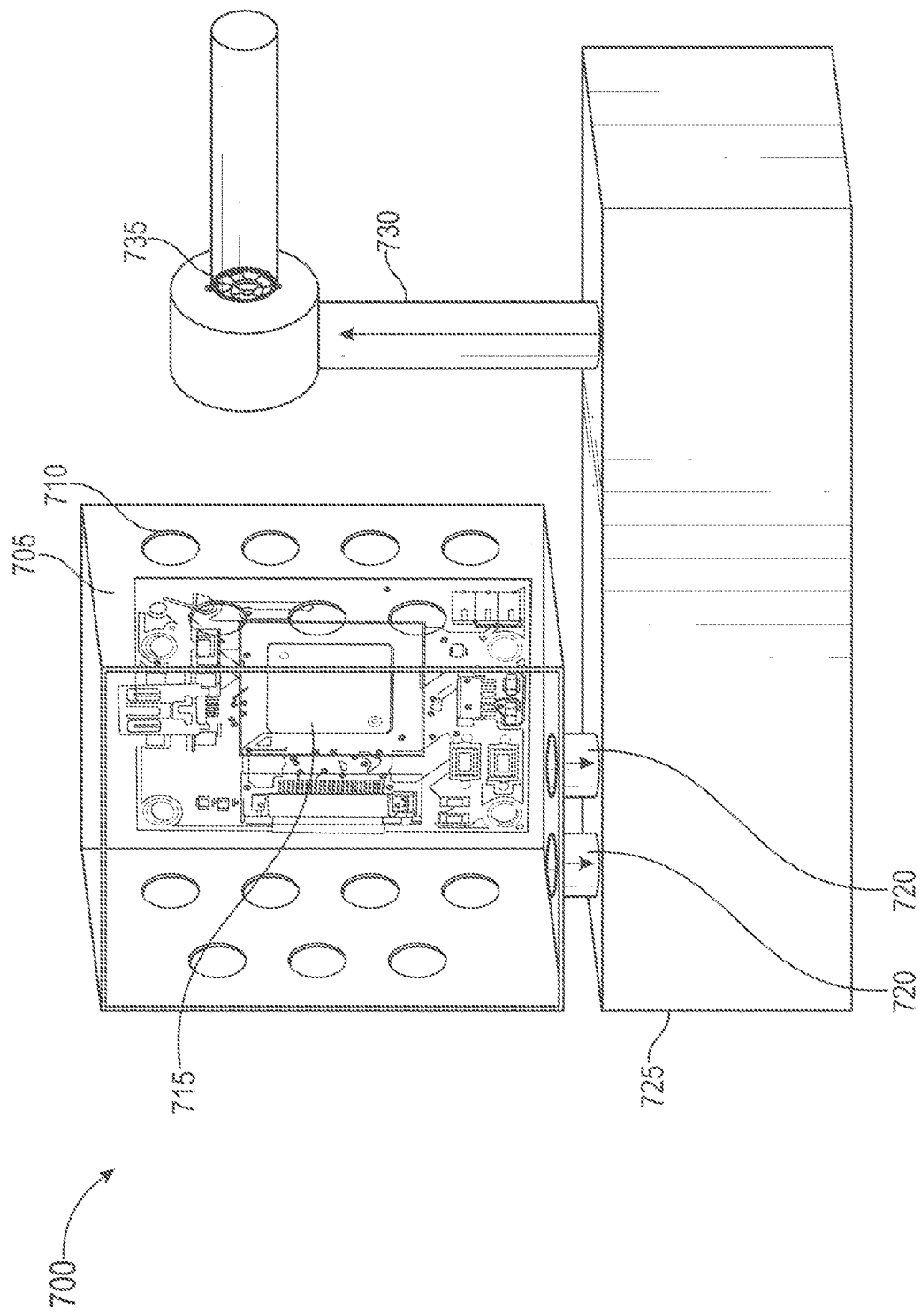
FIG. 7 is an illustration of the cooling system with a view of the inside of a chassis.

Referring to FIG. 7, FIG. 7 is an illustration of the cooling system 100 with a view of the inside of a chassis 705. The chassis 705 may contain a heat generating component 112. As shown in FIG. 7, the heat generating component 112 is a vehicle computer 715. The vehicle computer 715, like many heat generating components 112, becomes hot with use and degrades in performance unless the vehicle computer 715 reduces in temperature. In various embodiments, the heat generating component 112 may comprise other vehicle components such as a monitor, a radio or speakers.

To cool the vehicle computer 715, air 104 may enter the chassis 705 through one or more openings 710 in the chassis 705. As the air passes over the vehicle computer 715, the air may cool the vehicle computer 715 by convection. In turn, the vehicle computer 715 may heat the air. As shown in FIG. 7 by the arrows, the heated air may be directed from the chassis 705 to the manifold 725 by flowing through a conduit 720. In various embodiments, the conduit 720 may contain a check valve that prevents the heated air from flowing in the opposite direction from the manifold 725 to the chassis 705.

The heated air may be concentrated in the manifold 725. The heated air in the manifold 725 may be further directed to flow through the exhaust duct 730. The exhaust duct 730 may contain various valves that control the flow of air through the cooling system 100. Although not shown in FIG. 7, the exhaust duct 730 may branch in various embodiments into two or more downstream directions. In the exhaust duct 730, a fan 735 may propel the heated air. In an exemplary embodiment, the fan 735 may receive signals from the controller 216 that, when executed, operate the fan 735.

Figure 8:
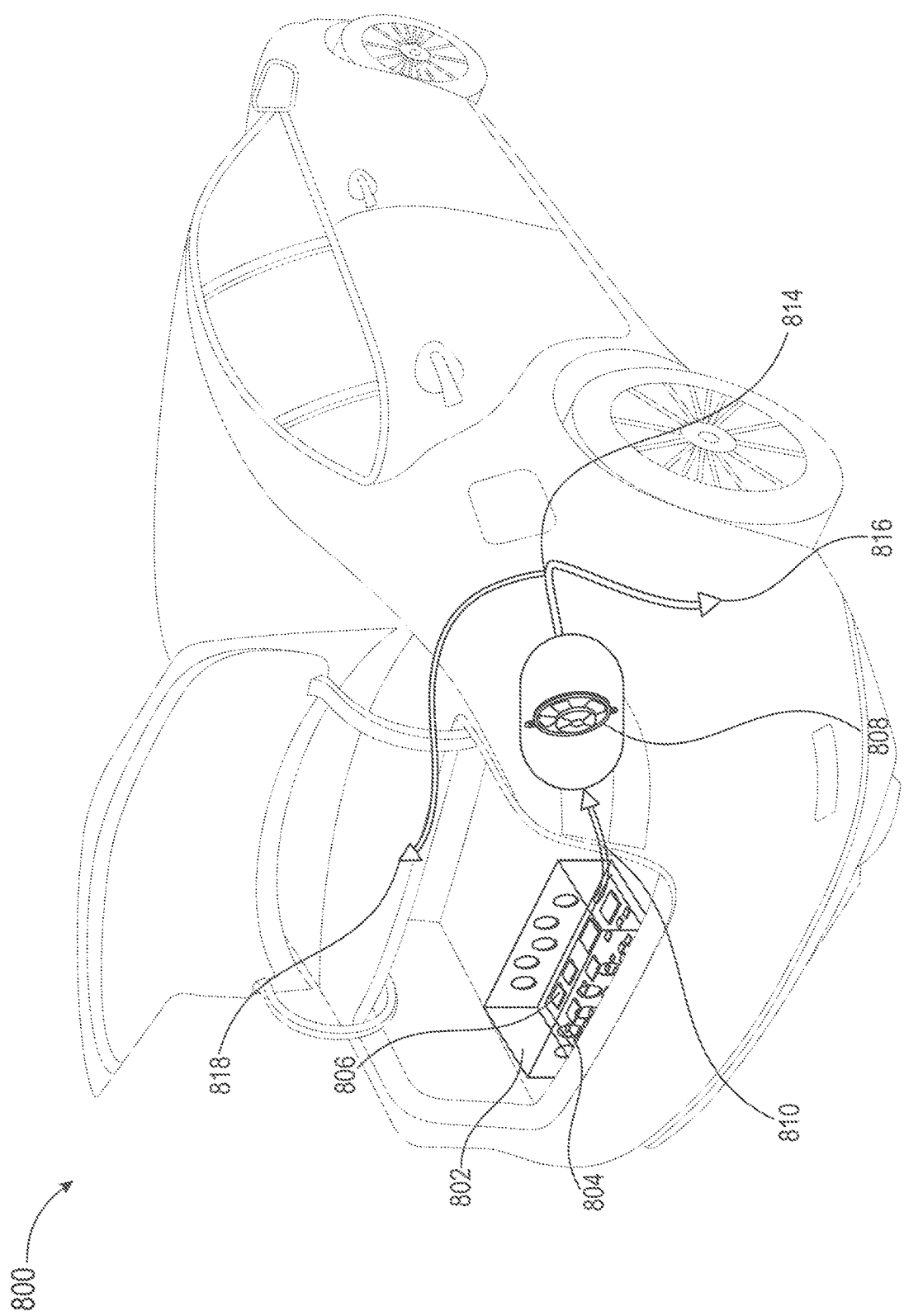
FIG. 8 is an illustration of the cooling system in a vehicle.

Referring to FIG. 8, FIG. 8 is an illustration of the cooling system 100 in a vehicle 800. The vehicle 800 may be various mechanisms that effectuate the transportation of people and/or goods including automobiles, trucks, airplanes, and trains. In addition to vehicle drive components 140 such as a motor 142 and energy storage 146, the vehicle 800 may contain one or more heat generating components that share air that is in thermal equilibrium with the interior area 130 of the vehicle 800. The interior area 130 of the vehicle 800 may comprise a passenger area inside the vehicle 800.

As shown in FIG. 8, the heat generating component 112 may be an electronic computing device 806 inside a chassis 802 with multiple openings 804. Air that is in thermal equilibrium with the passenger compartment of the vehicle 800 may enter the chassis 802 through the multiple openings 804. A fan 808 in an exhaust duct 810 may provide suction to pull air into the chassis 802 whereby the air is heated by the electronic computing device 806 as the electronic computing device is cooled by the air.

The fan 808 may also provide pressure downstream of the fan in the exhaust duct 810 to push the heated air through the exhaust duct 810. In various embodiments, the exhaust duct 810 may branch into two or more downstream directions. As shown in FIG. 8, the exhaust duct 810 branches at a fork 814 into two downstream directions. The fork 814 may contain a three-way valve 204 that is configured to control the direction of the air as the air reaches the fork 814. One of the downstream directions is an exit 816 that expels the heated air into the environment. The other downstream direction of the exhaust duct delivers the heated air to a vehicle component 202 to be heated by the heated air. As shown in FIG. 8, the heated air is delivered to the vehicle window to heat the window. Various other vehicle components may be heated by the heated air such as vehicle seats.

Figure 9:
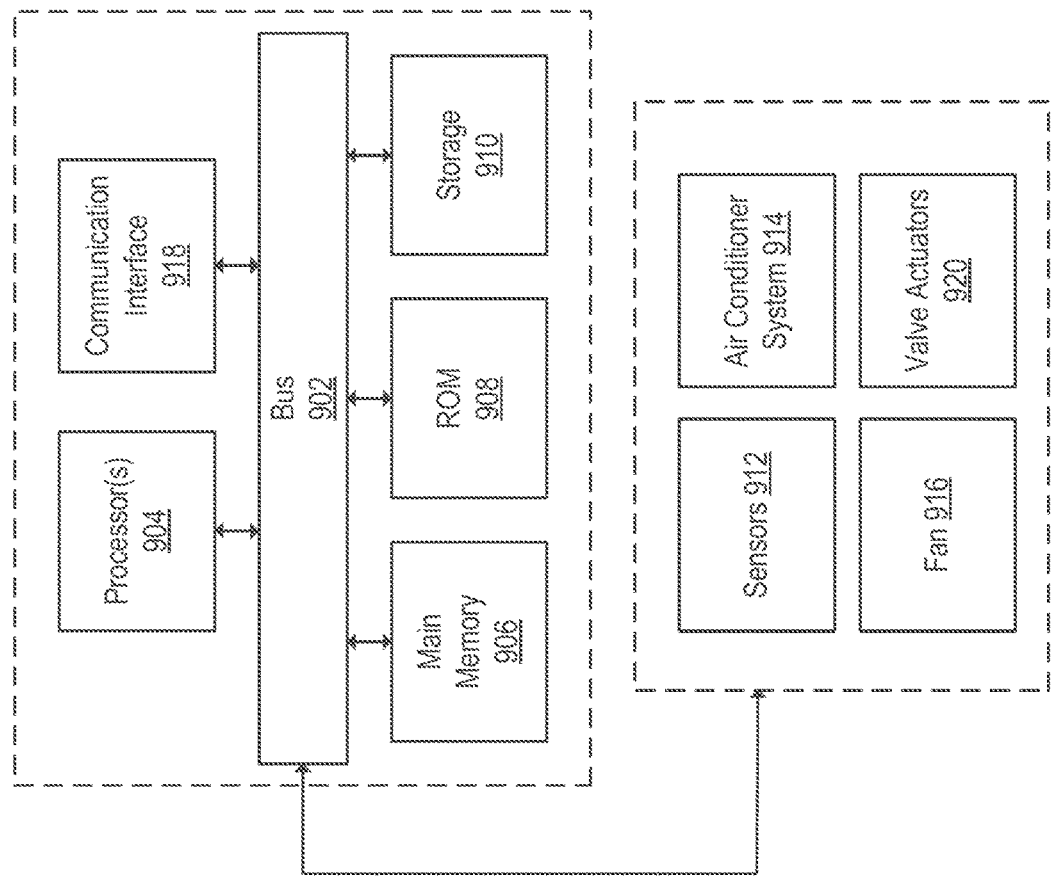
FIG. 9 is a schematic illustrating the computing components that may be used to implement various features of embodiments described in the present disclosure.

FIG. 9 is a block diagram that illustrates a computer system 900 upon which various embodiments of the controller 216 may be implemented. The computer system 900 includes a bus 902 or other communication mechanism for communicating information, one or more hardware processors 904 coupled with bus 902 for processing information. The bus 902 connects the internal components of the computer system 900.

The computer system 900 also includes a main memory 906, such as random access memory (RAM), cache and/or other dynamic storage devices, coupled to bus 902 for storing information and instructions to be executed by processor 904. Main memory 906 also may be used for storing temporary variables or other intermediate information during execution of instructions to be executed by processor 904. Such instructions, when stored in storage media accessible to processor 904, render the computer system 900 into a special-purpose machine that is customized to perform the operations specified in the instructions.

The computer system 900 further includes a read only memory (ROM) 908 or other static storage device coupled to bus 902 for storing static information and instructions for processor 904. A storage device 910, such as a magnetic disk, optical disk, or USB thumb drive (Flash drive), etc., is provided and coupled to bus 902 for storing information and instructions.

The computer system 900 may be coupled via bus 902 to an output device, such as a cathode ray tube (CRT) or LCD display (or touch screen), for displaying information to a computer user. The sensors 912 may be coupled to the bus 902, to communicate information regarding various components of cooling system 100 such as the heat generating component 112, the manifold 114, and the vehicle component 202.

The bus 902 may be coupled to the air conditioner system 914 such that instructions from the controller 216 may be executed by the air conditioner system 914. Similarly, the fan 916 may be coupled to the bus 902 such that instructions from the controller 216 may be executed by the fan 916. The bus 902 may be coupled to valve actuators 920 that, when activated move to change the state of various valves in the cooling system 100. For example, the processor 904 may instruct an actuator of the stop valve 210 to close, resulting in the cessation of air flow through the cooling system 100.

The computer system 900 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

In general, the word "module," as used herein, refers to logic embodied in hardware or firmware, or to a collection of software instructions, possibly having entry and exit points, written in a programming language, such as, for example, Java, C or C++. A software module may be compiled and linked into an executable program, installed in a dynamic link library, or may be written in an interpreted programming language such as, for example, BASIC, Perl, or Python. It will be appreciated that software modules may be callable from other modules or from themselves, and/or may be invoked in response to detected events or interrupts. Software modules configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware modules may be comprised of connected logic units, such as gates and flip-flops, and/or may be comprised of programmable units, such as programmable gate arrays or processors 904. The modules or computing device functionality described herein are preferably implemented as software modules, but may be represented in hardware or firmware. Generally, the modules described herein refer to logical modules that may be combined with other modules or divided into sub-modules despite their physical organization or storage.

The computer system 900 may implement the techniques described herein using customized hard-wired logic, one or more ASICs or FPGAs, firmware and/or program logic which in combination with the computer system 900 causes or programs the computer system 900 to be a special-purpose machine. According to one embodiment, the techniques herein are performed by computer system 900 in response to processor(s) 904 executing one or more sequences of one or more instructions contained in main memory 906. Such instructions may be read into main memory 906 from another storage medium, such as storage device 910. Execution of the sequences of instructions contained in main memory 906 causes processor(s) 904 to perform the process steps described herein. In alternative embodiments, hard-wired circuitry may be used in place of or in combination with software instructions.

The term "non-transitory media," and similar terms, as used herein refers to any media that store data and/or instructions that cause a machine to operate in a specific fashion. Such non-transitory media may comprise non-volatile media and/or volatile media. Non-volatile media includes, for example, optical or magnetic disks, such as storage device 910. Volatile media includes dynamic memory, such as main memory 906. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Non-transitory media is distinct from but may be used in conjunction with transmission media. Transmission media participates in transferring information between non-transitory media. For example, transmission media includes coaxial cables, copper wire and fiber optics, including the wires that comprise bus 902. Transmission media can also take the form of acoustic or light waves, such as those generated during radio-wave and infra-red data communications.

Various forms of media may be involved in carrying one or more sequences of one or more instructions to processor 904 for execution. For example, the instructions may initially be carried on a magnetic disk or solid-state drive of a remote computer. The remote computer can load the instructions into its dynamic memory and send the instructions over a telephone line using a component control. A component control local to computer system 900 can receive the data on the telephone line and use an infra-red transmitter to convert the data to an infra-red signal. An infra-red detector can receive the data carried in the infra-red signal and appropriate circuitry can place the data on bus 902. Bus 902 carries the data to main memory 906, from which processor 904 retrieves and executes the instructions. The instructions received by main memory 906 may retrieve and execute the instructions. The instructions received by main memory 906 may optionally be stored on storage device 910 either before or after execution by processor 904.

The computer system 900 also includes a communication interface 918 coupled to bus 902. Communication interface 918 provides a two-way data communication coupling to one or more network links that are connected to one or more local networks. For example, communication interface 918 may be an integrated services digital network (ISDN) card, cable component control, satellite component control, or a component control to provide a data communication connection to a corresponding type of telephone line. As another example, communication interface 918 may be a local area network (LAN) card to provide a data communication connection to a compatible LAN (or WAN component to communicate with a WAN). Wireless links may also be implemented. In any such implementation, communication interface 918 sends and receives electrical, electromagnetic or optical signals that carry digital data streams representing various types of information.

A network link typically provides data communication through one or more networks to other data devices. For example, a network link may provide a connection through a local network to a host computer or to data equipment operated by an Internet Service Provider (ISP). The ISP in turn provides data communication services through the world-wide packet data communication network now commonly referred to as the "Internet". Local network and Internet both use electrical, electromagnetic or optical signals that carry digital data streams. The signals through the various networks and the signals on network link and through communication interface 918, which carry the digital data to and from computer system 900, are example forms of transmission media.

The computer system 900 can send messages and receive data, including program code, through the network(s), network link and communication interface 918. In the Internet example, a server might transmit a requested code for an application program through the Internet, the ISP, the local network and the communication interface 918.

The received code may be executed by processor 904 as it is received, and/or stored in storage device 910, or other non-volatile storage for later execution. Each of the processes, methods, and algorithms described in the preceding sections may be embodied in, and fully or partially automated by, code modules executed by one or more computer systems 900 or computer processors 904 comprising computer hardware. The processes and algorithms may be implemented partially or wholly in application-specific circuitry.

The various features and processes described above may be used independently of one another or may be combined in various ways. All possible combinations and sub-combinations are intended to fall within the scope of this disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed example embodiments. The example systems and components described herein may be configured differently than described. For example, elements may be added to, removed from, or rearranged compared to the disclosed example embodiments.

Any process descriptions, elements, or blocks in the flow diagrams described herein and/or depicted in the attached figures should be understood as potentially representing modules, segments, or portions of code which include one or more executable instructions for implementing specific logical functions or steps in the process. Alternate implementations are included within the scope of the embodiments described herein in which elements or functions may be deleted, executed out of order from that shown or discussed, including substantially concurrently or in reverse order, depending on the functionality involved.

It should be emphasized that many variations and modifications may be made to the above-described embodiments, the elements of which are to be understood as being among other acceptable examples. All such modifications and variations are intended to be included herein within the scope of this disclosure. The foregoing description details certain embodiments of the invention. It will be appreciated, however, that no matter how detailed the foregoing appears in text, the invention can be practiced in many ways. As is also stated above, it should be noted that the use of particular terminology when describing certain features or aspects of the invention should not be taken to imply that the terminology is being re-defined herein to be restricted to including any specific characteristics of the features or aspects of the invention with which that terminology is associated. The scope of the invention should therefore be construed in accordance with the appended claims and any equivalents thereof.

The various operations of example methods described herein may be performed, at least partially, by one or more processors 904 that are temporarily configured (e.g., by software) or permanently configured to perform the relevant operations. Similarly, the methods described herein may be at least partially processor-implemented, with a particular processor 904 or processors 904 being an example of hardware. For example, at least some of the operations of a method may be performed by one or more processors 904. Moreover, the one or more processors 904 may also operate to support performance of the relevant operations in a "cloud computing" environment or as a "software as a service" (SaaS). For example, at least some of the operations may be performed by a group of computers (as examples of machines including processors 904), with these operations being accessible via a network (e.g., the Internet) and via one or more appropriate interfaces (e.g., an Application Program Interface (API)).

The performance of certain of the operations may be distributed among the processors 904, not only residing within a single machine, but deployed across a number of machines. In some example embodiments, the processors 904 may be located in a single geographic location (e.g., within a home environment, an office environment, or a server farm). In other example embodiments, the processors 904 may be distributed across a number of geographic locations.

Language

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the subject matter has been described with reference to specific example embodiments, various modifications and changes may be made to these embodiments without departing from the broader scope of embodiments of the present disclosure. Such embodiments of the subject matter may be referred to herein, individually or collectively, by the term "invention" merely for convenience and without intending to voluntarily limit the scope of this application to any single disclosure or concept if more than one is, in fact, disclosed.

The embodiments illustrated herein are described in sufficient detail to enable the practice of the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

Conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Although the invention has been described in detail for the purpose of illustration based on what is currently considered to be the most practical and preferred implementations, it is to be understood that such detail is solely for that purpose and that the invention is not limited to the disclosed implementations, but, on the contrary, is intended to cover modifications and equivalent arrangements that are within the spirit and scope of the appended claims. For example, it is to be understood that the present invention contemplates that, to the extent possible, one or more features of any embodiment can be combined with one or more features of any other embodiment.

The invention claimed is:
1. A system, the system comprising:
an air conditioner configured to selectively transmit and modify an amount of precooled air to a heat generating component, based on historical data from the heat generating component, wherein the historical data comprises an extent of an increase in a temperature of the heat generating component upon the heat generating component performing an activity or being in a particular state for at least a threshold amount of time;
a chassis, inside an interior area of a vehicle, with one or more openings that are configured to allow air to enter the chassis to cool the heat generating component in the vehicle;
an exhaust duct that directs the air away from the chassis after the air has contacted at least a portion of the heat generating component, the exhaust duct comprising a three-way valve connected to a first branch and a second branch, wherein the first branch is connected to an exit of the vehicle and the second branch is connected to a different vehicle component, the three-way valve comprises a motor that is configured to switch a direction towards which the air is directed from the first branch to the second branch based on an amount of heat generated by the heat generating component or based on a temperature of the heat generating component;
a fan inside the exhaust duct that acts to propel the air through the one or more openings and through the exhaust duct, wherein the fan is configured to switch from a deactivated state to an activated state based on the temperature of the heat generating component.

2. The system of claim 1, further comprising:
a manifold that is configured to receive the air from the heat generating component; and
wherein the exhaust duct is connected to the manifold.

3. The system of claim 2, wherein the heat generating component is an electronic component with a processor.

4. The system of claim 1:
wherein the air conditioning system is configured to modify an output of the air conditioning system responsive to a temperature of the electronic component.

5. The system of claim 4, wherein the air conditioning system is configured to direct air that is cooled by the air conditioning system separately into two or more vehicle chambers; the vehicle chambers comprising:
a cabin of the vehicle; and
the chassis.

6. The system of claim 1, wherein the exhaust duct is positioned to direct the air, after the air has been heated by the heat generating component, into one or more vehicle components.

7. The system of claim 6, wherein the one or more vehicle components comprise one or more windows.

8. The system of claim 1, wherein the fan is positioned inside the exhaust duct.

9. The system of claim 1, wherein the exhaust duct directs the air towards a window upon detecting fogging of the window.

10. The system of claim 1, wherein the air conditioner is configured to selectively transmit and modify the amount of precooled air by determining a timing at which the precooled air is supplied to the heat generating component.

11. The system of claim 1, further comprising a controller that is connected to and coordinates operations of the air conditioner, the chassis, and the fan.

12. A method for cooling a heat generating component, the method comprising:
selectively transmitting and modifying, by an air conditioner, an amount of precooled air to the heat generating component, based on historical data from the heat generating component, wherein the historical data comprises an extent of an increase in a temperature of the heat generating component upon the heat generating component performing an activity or being in a particular state for at least a threshold amount of time;
cooling the heat generating component within an interior area in a vehicle with air that enters a chassis through one or more openings in the chassis;
directing the air away from the chassis in an exhaust duct after the air has cooled the heat generating component, the exhaust duct comprising a three-way valve connected to a first branch and a second branch, wherein the first branch is connected to an exit of the vehicle and the second branch is connected to a different vehicle component, the three-way valve comprising a motor;
switching, using the motor, a direction towards which the air is directed from the first branch to the second branch based on an amount of heat generated by the heat generating component or based on a temperature of the heat generating component;
propelling the air out of the chassis through the exhaust duct with a fan; and
switching the fan from a deactivated state to an activated state based on the temperature of the heat generating component.

13. The method of claim 12:
wherein a manifold is configured to receive air from the heat generating component; and
wherein the exhaust duct is connected to the manifold.

14. The method of claim 12: wherein the air conditioning system is configured to modify an output of the air conditioning system responsive to a temperature of the electronic component; and wherein the air conditioning system is further configured to modify the output of the air conditioning system based on historical data from the electronic component.

15. The method of claim 14, wherein the air conditioning system is configured to direct air that is cooled by the air conditioning system separately into two or more vehicle chambers; the two or more vehicle chambers comprising:
a cabin of the vehicle; and
the chassis.

16. The method of claim 12, wherein the exhaust duct is positioned to direct the air, after the air has been heated by the heat generating component, into one or more vehicle components.

17. A system, the system comprising:
an air conditioner configured to selectively transmit and modify an amount of precooled air, to a heat generating component, based on historical data from the heat generating component, wherein the historical data comprises an extent of an increase in a temperature of the heat generating component upon the heat generating component performing an activity or being in a particular state for at least a threshold amount of time;
one or more openings that are configured to allow air to enter a chassis to cool an electronic component with a processor in a vehicle;

an exhaust duct that directs the air away from the chassis after the air has cooled the electronic component, the exhaust duct comprising a three-way valve connected to a first branch and a second branch, wherein the first branch is connected to an exit of the vehicle and the second branch is connected to a different vehicle component, the three-way valve comprises a motor that is configured to switch a direction towards which the air is directed from the first branch to the second branch based on an amount of heat generated by the heat generating component or based on a temperature of the heat generating component;

a fan inside the exhaust duct that acts to force the air into the one or more openings and out through the exhaust duct, wherein the fan is configured to switch from a deactivated state to an activated state based on the temperature of the heat generating component;

a manifold that is configured to receive the air from the electronic component; and the exhaust duct is connected to the manifold.

\* \* \* \* \*